United States Patent [19]

Daniels et al.

[11] 3,904,978

[45] Sept. 9, 1975

[54] ACTIVE RESISTOR-CAPACITOR FILTER ARRANGEMENT

[75] Inventors: Richard William Daniels; Carl Ferdinand Kurth, both of Andover, Mass.

[73] Assignee: Bell Telephone Laboratories, Incorporated, Murray Hill, N.J.

[22] Filed: Aug. 8, 1974

[21] Appl. No.: 495,639

[52] U.S. Cl. .................................. 330/109; 328/167
[51] Int. Cl.² ........................................... H03F 1/36
[58] Field of Search ............... 330/21, 31, 107, 109; 328/167

[56] References Cited

UNITED STATES PATENTS

| | | | |
|---|---|---|---|
| 3,525,949 | 8/1970 | Fjallbrant | 330/109 X |
| 3,566,284 | 2/1971 | Thelen | 328/155 |
| 3,609,567 | 9/1971 | Kerwin et al. | 328/167 |

OTHER PUBLICATIONS

Hanneman, "Higher-Order RC-Active Filters," *Philips Res. Repts.* 26, 1971, pp. 65–74.

Hakim, "RC Active Filters using an Armature as the Active Element," *Proceedings of IEEE*, Vol. 112, No. 5, May 1965, pp. 901–1014.

Moschytz et al., "Design of Hybrid Integrated-Filter Building Blocks," *IEEE J. of Solid-State Circuits*, Vol. SC-5, No. 3, June 1970, pp. 99–107.

Friend, "A Single Operational-Amplifier Biquadratic Filter Section," 1970 IEEE International Symposium on Circuit Theory, Dec., 1970.

*Primary Examiner*—James B. Mullins
*Attorney, Agent, or Firm*—Thomas Stafford

[57] ABSTRACT

An active filter having a predetermined fourth-order transfer function is realized by employing a single gain unit, for example, a differential amplifier, in conjunction with two passive resistor-capacitor (RC) circuits. The RC circuits have pole-zero pairs which are widely separated in frequency. Consequently, each RC circuit does not cause appreciable distortion in the attenuation characteristic of the filter in the frequency band in which the other RC circuit is affecting the filter attenuation characteristic.

12 Claims, 8 Drawing Figures

ACTIVE RESISTOR-CAPACITOR FILTER ARRANGEMENT

BACKGROUND OF THE INVENTION

This invention relates to filter circuits, and more particularly, to active filter circuits employing active gain units, for example, differential or so-called operational amplifiers.

Active filter arrangements are now well known in the art. Of these filters much interest has been generated in the field of active resistor-capacitor (RC) circuits. As the name implies, an active RC circuit is one composed solely of resistors, capacitors and some form of active gain unit. The gain unit may include, for example, single or multiple differential amplifier arrangements.

Of the now numerous active RC filter circuits, the second-order or biquadratic (second-order over second-order) active filter has engendered much interest. Second-order active filters have been cascaded to realize any one of a number of desired filter characteristics. Of particular interest among the many available characteristics, however, is the fourth-order transfer function usually obtained by cascading two active filters having second-order transfer functions. The technique of cascading second-order filters in order to realize a desired fourth-order transfer function has been satisfactory for certain applications. However, cascading of individual filter sections is unsatisfactory for other applications because of the required use of two gain units and, hence, two or more differential amplifiers. The use of two gain units to obtain the desired function is expensive and, therefore, undesirable.

Attempts have been made to realize the desired fourth-order active filter by employing one active gain unit. One such attempt employs a negative impedance converter which may employ a single differential amplifier. The negative impedance converter realizations of a fourth-order function have been found to have a tendency to become unstable very easily. This undesirable characteristic has made the use of negative impedance converters to obtain higher order filter characteristics unattractive for most applications.

Another problem with prior known fourth-order active filters is related to adjusting the values of circuit components in order to tune the circuit to realize a desired precision in the attenuation versus frequency characteristic.

SUMMARY OF THE INVENTION

These and other problems are resolved, in accordance with the principles of this invention, in an RC active filter having a fourth-order transfer function realized by employing a single active gain unit in conjunction with first and second attenuation versus frequency determinate circuits. The attenuation versus frequency determinate circuits include passive components, for example, resistors and capacitors, arranged in predetermined circuit relationship with the active gain unit. Each of the attenuation determinate circuits has pole-zero pairs separated from those of the other attenuation determinate circuit in frequency. Consequently, each circuit does not cause appreciable distortion in the attenuation versus frequency characteristic of the filter in the frequency band in which the other circuit is affecting the filter output characteristic. Simply stated, each of the passive attenuation versus frequency determinate circuits is arranged to yield a constant attenuation in the frequency band in which the other is affecting the attenuation versus frequency characteristic of the filter.

More specifically, an active RC filter having a predetermined fourth-order transfer function is realized by employing a single gain unit, for example, a unit employing one or more differential amplifiers or other amplification device and two passive RC attenuation versus frequency determinate circuit arrangements. The individual passive RC circuits are arranged in conjunction with the gain unit to generate second-order functions, for example, a low-pass and a high-pass, which form the desired fourth-order transfer function. One of the passive circuits is arranged in circuit relationship with the input and output of the gain unit while the other passive circuit is arranged in circuit relationship with the input of the first circuit and the gain unit output. Signals to be filtered are supplied to the input of the second passive circuit while a filtered version of the input is obtained at the output of the gain unit.

In one embodiment of the invention, a gain unit is utilized which employs a single differential amplifier.

DETAILED DESCRIPTION

Figure 1:
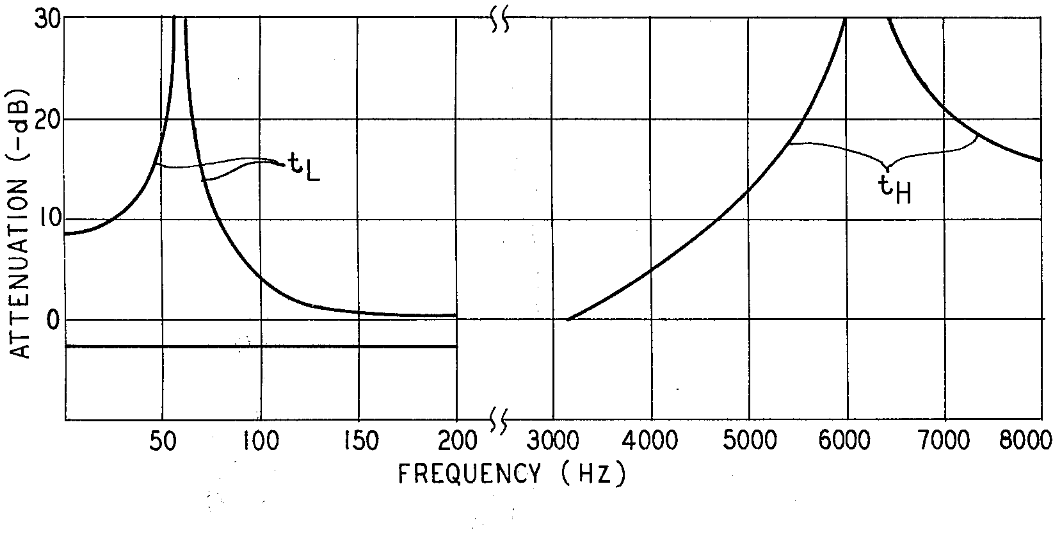
FIG. 1 depicts in graphic form attenuation versus frequency characteristics useful in describing the invention.

In numerous filter applications, it is desirable to employ a filter circuit arrangement having a fourth-order transfer function generally defined as $$T(s) = \frac{K(s^2+\omega_1^2)\,(s^2+\omega_2^2)}{\left(s^2+\frac{\omega_L}{Q_L}s+\omega_L^2\right)\left(s^2+\frac{\omega_H}{Q_H}s+\omega_H^2\right)} \qquad (1)$$

where $T(s)$ is the transfer function, $K$ is a gain factor, $\omega_1$ and $\omega_2$ determine the zero frequencies of transmission of $T(s)$, $\omega_L$ and $\omega_H$ determine the pole frequencies of transmission of $T(s)$, and $Q_L$ and $Q_H$ are the quality factors of the corresponding poles. Such a fourth-order transfer function has heretofore been realized by decomposing Equation 1 into a product of second-order or biquadratic (second-order over second-order) terms and obtaining each product term by a separate active filter circuit. The separate filter circuits are then cascaded to obtain the desired fourth-order function. Second-order active RC filters which heretofore have been cascaded to realize a desired fourth-order active filter are now well known in the art. For example, U.S. Pat. No. 3,566,284, issued Feb. 23, 1971, describes an active RC filter employing a parallel-T network to obtain a second-order low-pass function and copending application Ser. No. 251,805, filed May 9, 1972, describes a so-called "biquad" RC active filter which may be employed to obtain another second-order function, for example, either a low-pass or a high-pass function. For other examples of second-order active filter arrangements, see an article by G. S. Moschytz and W. Thelen entitled "Design of Hybrid Integrated-Filter Building Blocks," *IEEE Journal of Solid State Circuits*, June 1970, page 99, and an article by J. J. Friend entitled "A Single Operational Amplifier Biquadratic Filter Section," 1970 *IEEE International Symposium on Circuit Theory Digest of Technical Papers*, December 1970, page 179. These prior known circuit arrangements may simply be cascaded to realize the transfer function as defined in Equation 1. As stated above, such a cascaded arrangement, however, necessarily requires the use of at least two or more gain units, each of which employs one or more differential amplifiers or other amplification devices. The added expense of and the space required by the additional gain unit makes the cascaded arrangement undesirable for many applications.

The problems with the prior art cascaded arrangement are overcome in an active filter having a fourth-order transfer function by utilizing a single gain unit. To this end, we have recognized that a fourth-order function as defined by Equation 1 is realizable, in accordance with the invention, by employing a single gain unit in conjunction with passive RC attenuation versus frequency determinate circuits. However, the individual passive RC circuits utilized with the gain unit to obtain the second-order functions which form a desired fourth-order function must have widely separated pole-zero pairs. In practice, the desired fourth-order function is obtained, in accordance with the invention, by employing a multiple feedback approach in which a low-pass second-order or biquadratic filter section is first realized and then imbedded in a high-pass second-order or biquadratic filter section or vice versa. By embedding the first realized section in that of the other, the need for an additional gain unit is eliminated. Frequency shifts and loading effects of the individual filter sections on each other are compensated so that the pole-zero pairs of the individual second-order filter sections occur at frequencies so as to obtain the desired fourth-order function.

To illustrate the use of passive RC circuits having widely separated pole-zero pairs, let us consider an example, not to be construed as limiting the invention, in which the parameters of Equation 1 are:

$$\omega_1 = 2\pi f_1 = 2\pi \quad 60$$
$$\omega_L = 2\pi f_L = 2\pi \quad 100$$
$$Q_L = 1.0 \tag{2A}$$

and $$\omega_2 = 2\pi f_2 = 2\pi \quad 6000$$
$$\omega_H = 2\pi f_H = 2\pi \quad 3000$$
$$Q_H = 1.0 \tag{2B}$$

Equation 1 may be decomposed to yield $$t_L(s) = \frac{s^2 + \omega_1^2}{s^2 + \frac{\omega_L}{Q_L}s + \omega_L^2} \tag{3A}$$

and $$t_H(s) = \left(\frac{\omega_1^2}{\omega_L}\right) \frac{s^2 + \omega_2^2}{s^2 + \frac{\omega_H}{Q_H}s + \omega_H^2} \tag{3B}$$

The functions of Equation 3, utilizing the parameter values of Equation 2 are shown in graphic form in FIG. 1. From FIG. 1, it is seen that the desired fourth-order function $T(s)$ may be expressed in the desired frequency bands as follows:

Lower Stopband
$T(s) \approx k_1 t_L(s)$
Passband
$T(s) \approx k_1 t_L(s) \approx k_2 t_H(s)$
Upper Stopband
$T(s) \approx k_2 t_H(s)$ (4)

It is desired to obtain a single gain unit realization for transfer function $T(s)$ such that low frequency behaviour approximates a scaled version of $t_L(s)$ and such that high frequency behavior approximates a scaled version of $t_H(s)$. Therefore, the low frequency approximation of $T(s)$ is expressed as $$T_L(s) = K_L \frac{s^2 + \omega_1^2}{s^2 + \frac{\omega_L}{Q_L}s + \omega_L^2} \tag{5}$$

where $k_L$ is the low frequency scaling factor, and the high frequency approximation of $T(s)$ is expressed as $$T_H(s) = k_H \frac{s^2 + \omega_2^2}{s^2 + \frac{\omega_H}{Q_H}s + \omega_H^2} \tag{6}$$

where $k_H$ is the high frequency scaling factor.

Figure 2A:
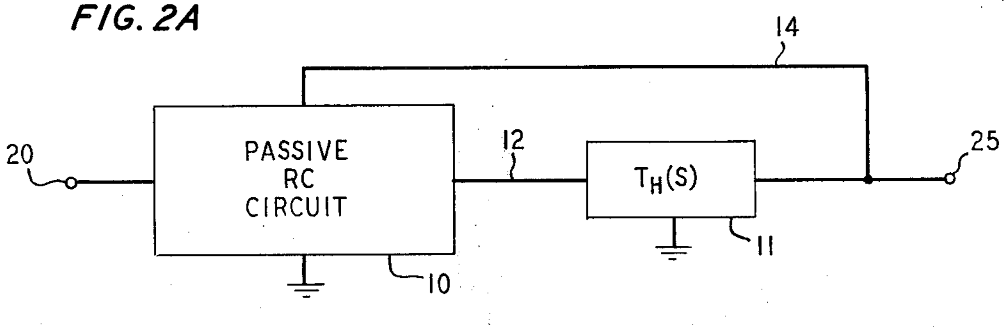
FIG. 2A shows in simplified block diagram form a generalized arrangement useful in describing the synthesis of an active RC filter arrangement illustrating the invention.

FIG. 2A depicts in simplified form a generalized arrangement useful in describing the synthesis of a circuit embodying the instant invention having a predetermined fourth-order transfer function. Accordingly, shown is passive RC circuit 10 connected in circuit relationship via circuit path 12 with an input of circuit 11 and via circuit path 14 with an output of circuit 11. Circuits 10 and 11 are connected to a reference potential point, namely, ground potential. A signal to be filtered is supplied via terminal 20 to an input of circuit 10 while a filtered version of this supplied signal is developed at output terminal 25. Circuit 10 and circuit 11 form a composite circuit having the desired fourth-order transfer function $T(s)$.

Figure 2B:
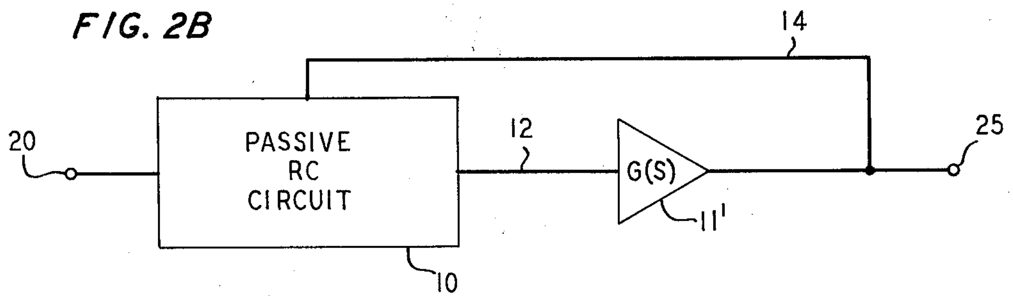
FIG. 2B depicts a "low" frequency approximation of the arrangement of FIG. 2A.

FIG. 2B illustrates a "low" frequency approximation of the circuit of FIG. 2A. In this example, RC circuit 10 is employed in conjunction with gain unit 11' of circuit 11 (FIG. 2A) to realize a scaled version of the low frequency attenuation versus frequency characteristic $t_L(s)$ as shown in FIG. 1, namely, $T_L(s)$ as expressed in Equation 5. Function $G(o)$ of circuit 11' is the "low" frequency equivalent of function $T_H(s)$ which, as stated above, is substantially a constant in the frequency band that circuit 10 is affecting the attenuation characteristic of the filter. Thus, we can utilize a "low" frequency approximation $G(s) \approx T_H(s)$. An appropriate circuit arrangement and component values are used to obtain a desired $T_L(s)$ function.

Figure 3:
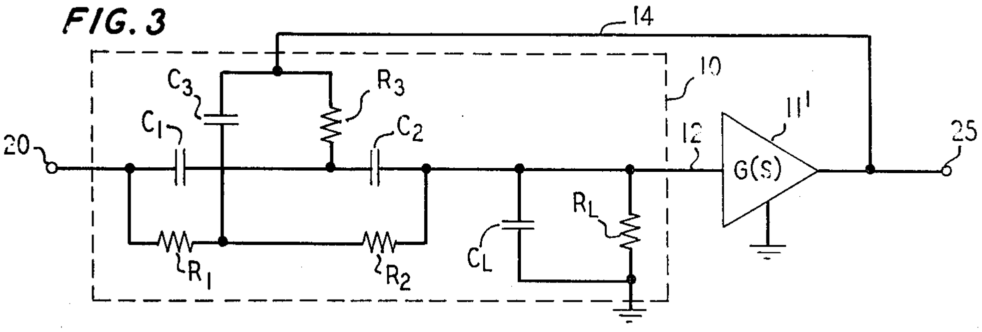
FIG. 3 shows details of a second-order active RC filter which may be utilized to realize the low frequency characteristic of FIG. 1.

A circuit arrangement which may be utilized to synthesize the low frequency approximation shown in FIG. 2B to obtain a scaled version the low frequency function $t_L(s)$ shown in FIG. 1, not to be construed as limiting the scope of the invention, is the low-pass active Twin-T circuit shown in FIG. 3. Both symmetrical and unsymmetrical active Twin-T second-order circuits are well known in the art and have beem employed to synthesize desired filter characteristics. The values of the individual circuit components and function $G(o)$ required to obtain the low-frequency transfer function $T_L(s)$ are readily obtainable by employing well-known circuit techniques. Again, see the G. S. Moschytz and W. Thelen article and the J. J. Friend article cited above for design considerations for such second-order circuits.

In practice, the capacitor values used in hybrid integrated circuit filter embodiments are usually chosen somewhat arbitrarily because thin-film capacitors cannot be adjusted once manufactured. Thus, once the capacitors are made, their values are fixed and the hybrid integrated filter circuit must be tuned to operate as desired by adjusting the resistor values. Design values of circuit components for the circuit shown in FIG. 3 to obtain the design parameters set out in Equation 2A, not to be construed as limiting the scope of the invention, are:

$$C_1 = C_2 = 1.7 \times 10^{-8}$$
$$C_3 = 1.0 \times 10^{-7}$$
$$C_L = 6.7 \times 10^{-9}$$
$$G(o) = 1.788$$
$$R_1 = 36{,}865$$
$$R_2 = 224{,}545$$
$$R_3 = 93{,}136$$
$$R_L = 65{,}891$$

where the capacitor values are in farads and the resistor values are in ohms. Gain unit 11' may be any one of numerous amplifier devices known in the art, for example, a Fairchild 741 differential amplifier.

Figure 2C:
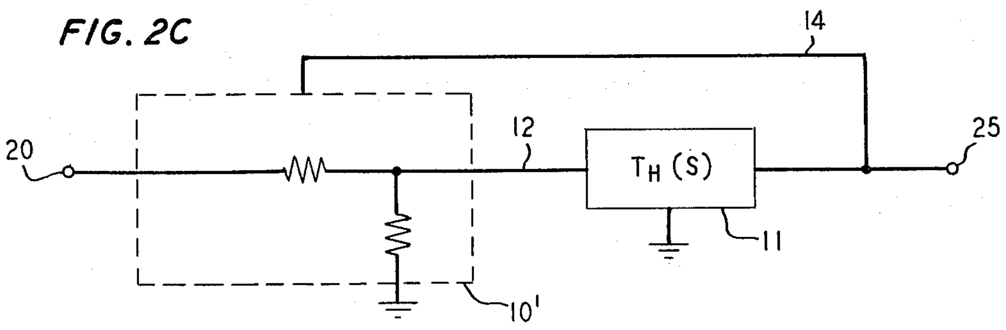
FIG. 2C shows a "high" frequency approximation of the arrangement of FIG. 2A.

FIG. 2C illustrates a "high" frequency approximation of the circuit of FIG. 2A. In this example, circuit 10 of FIG. 2A appears substantially as voltage divider 10' with feedback circuit path 14 being essentially an open-circuit in the frequency band that circuit 11 is affecting the attenuation characteristic of the filter. Thus, a circuit arrangement is used in circuit 11 to obtain a scaled version of $t_H(s)$ as shown in FIG. 1, namely, function $T_H(s)$ as expressed in Equation 6.

Additionally, it is desired to embed one of the circuit approximations in the other in order to eliminate, in accordance with the invention, the need for an additional gain unit. This is achieved, in this example, by equating the high frequency function $T_H(s)$ approximately to equal the low frequency gain function namely, $G(s) \approx T_H(s)$.

Figure 4:
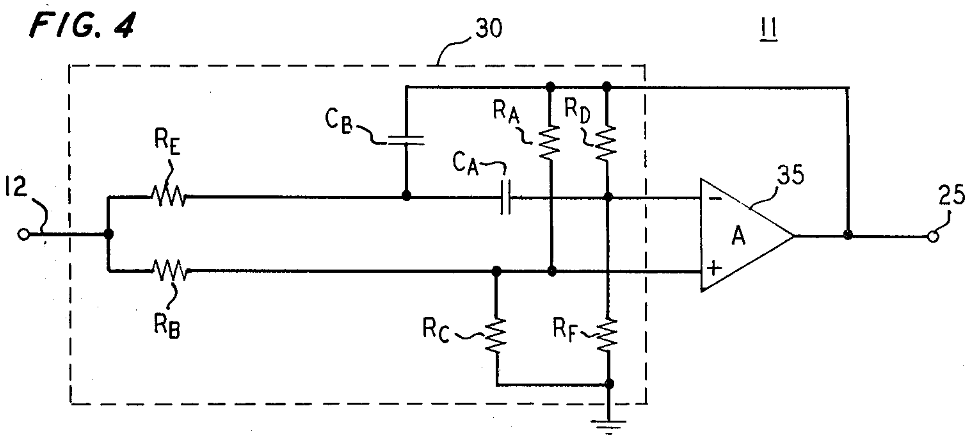
FIG. 4 depicts an active RC filter arrangement which may be used to synthesize the high frequency characteristic shown in FIG. 1.

A circuit which may be utilized to synthesize the high frequency approximation of $T(s)$, not to be construed as limiting the scope of the invention, is the so-called single differential amplifier "biquad" circuit shown in FIG. 4. Such "biquad" active filter circuits are now known in the art, and are more thoroughly described in copending application Ser. No. 251,805, and the J. J. Friend article cited above. Thus, the biquad arrangement shown in FIG. 4 is employed to synthesize the function $G(s) \approx T_H(s)$, where $T_H(s)$ is defined in Equation 6 and where $$k_H = G(o)\ (\omega_H/\omega_2)^2 . \tag{7}$$

The values of the individual circuit components employed in the circuit of FIG. 4 are dependent on the specific function $T_H(s)$ to be obtained and are readily determinable.

For the design parameters set out in Equation 2B and for $G(o) = 1.788$ a set of component values for the circuit of FIG. 4, not to be construed as limiting the scope of the invention, is as follows:

$CA = 5.0 \times 10^{-9}$
$CB = 5.0 \times 10^{-10}$
$RA = 41{,}000$
$RB = 22{,}368$
$RC = 18{,}085$
$RD = 33{,}213$
$RE = 21{,}359$
$RF = 21{,}872$ where the capacitor values are in farads and the resistor values are in ohms. Gain unit 35 may be any one of numerous amplifier devices now known in the art, for example, a Fairchild Semiconductor 741 differential amplifier.

Figure 5:
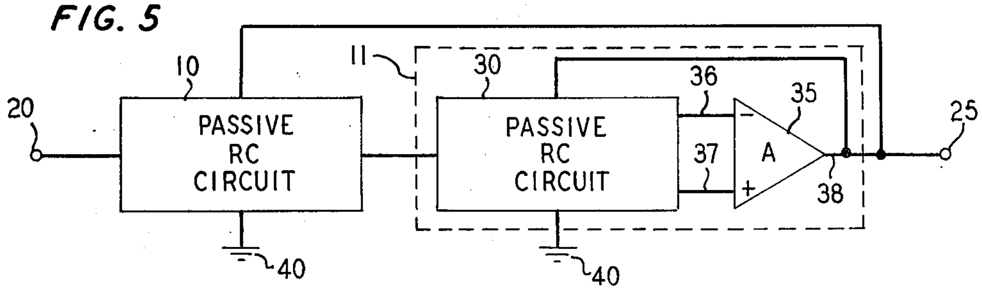
FIG. 5 shows in simplified block diagram form an active RC filter illustrating the invention.

Although the circuits of FIGS. 3 and 4 may each satisfy a portion of the desired transfer function $T(s)$, they each employ a separate gain unit. Consequently, the individual circuits must be combined in a manner to eliminate the need of the additional gain unit. As indicated above, we have recognized that elimination of the additional gain unit may be achieved by embedding one of the circuits in the other. Thus, FIG. 5 shows in simplified block diagram form a circuit arrangement illustrating the instant invention. A predetermined fourth-order function is realized by employing a single gain unit, for example differential amplifier 35, in conjunction with passive RC circuits 10 and 30. Circuits 10 and 30 may be any of numerous RC arrangements known in the art for obtaining second-order functions, for example, the arrangements shown in FIGS. 3 and 4. It is again noted, however, that the pole-zero pairs of circuits 10 and 30 must be widely separated. The specific circuit configurations employed necessarily depend on the specific transfer function $T(s)$ to be obtained. In this example, gain unit 35 is shown in a balanced input arrangement having input terminals 36 and 37 and output terminal 38.

Gain unit 35 may include one or more amplification devices, for example, differential amplifiers. In this example, passive RC circuit 30 is connected in circuit with input terminals 36 and 37 and output terminal 38 of gain unit 35, and in circuit with reference potential point 40. Although the outputs of RC circuit 30 are shown as connected in circuit with both inputs 36 and 37 of gain unit 35 in a balanced arrangement, the output from circuit 30 may, if desired, be single ended. Again, this depends on the specific transfer function which is to be obtained. Passive circuit 30 and gain unit 35 form a circuit arrangement which yields the function $T_H(s)$, as defined in Equation 6. Passive RC circuit 10 is connected in circuit via circuit path 12 with an input of passive circuit 30, via circuit path 14 with output 38 of gain unit 35, input 20 and reference potential point 40. Passive circuit 10 is arranged to yield a substantially constant attenuation in the frequency band in which circuit 30 is affecting the attenuation characteristic of the filter. Thus, circuit 30 in conjunction with amplifier 35 and circuit 10 forms a filter circuit arrangement which yields the high-pass function $T_H(s)$. Similarly, passive circuit 30 is arranged to yield a substantially constant attenuation in the frequency band in which circuit 10 is affecting the attenuation characteristic of the filter. Thus, circuit 10 in conjunction with gain unit 35 and circuit 30 form a filter circuit arrangement which yields the function $T_L(s)$ as defined in Equation 5.

Since only one gain unit is employed in conjunction with two passive RC circuits to obtain the function $T(s)$, there is necessarily some interaction between RC circuits 10 and 30 causing shifts in the pole-zero pairs because of loading, which requires compensation. This compensation is obtained by adjusting the values the individual circuit components and depends on the function to be realized and on the circuits employed to obtain the function. A compensation technique employed in practicing this invention is described below in relation to a specific embodiment of the invention.

Figure 6:
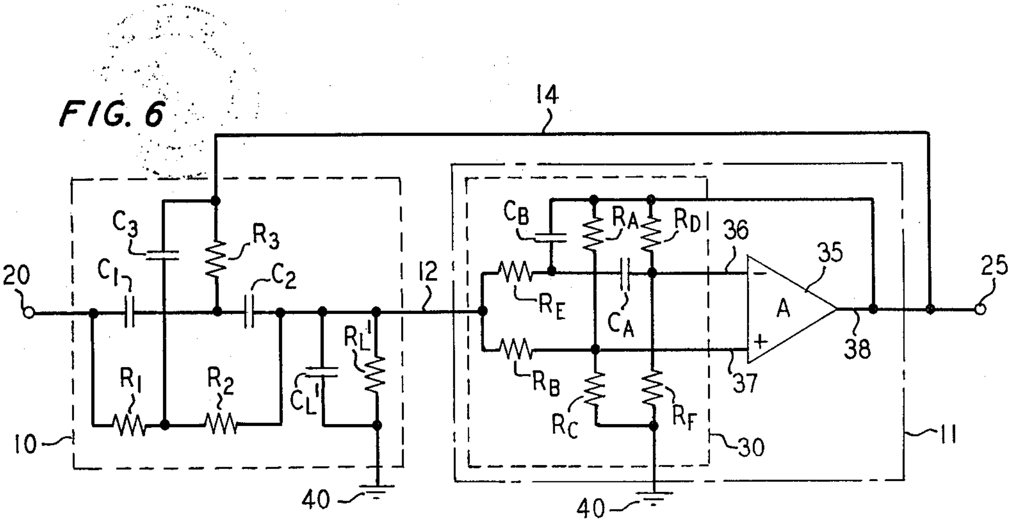
FIG. 6 depicts details of one embodiment of the invention.

FIG. 6 shows details of one embodiment of the instant invention which employes single gain unit 35 in conjunction with passive RC circuits 10 and 30 to obtain a desired fourth-order transfer function $T(s)$ as defined in Equation 1. Circuit components which perform similar functions as those described in relation to prior figures have been similarly numbered and will not again be described in detail. As indicated above, a single gain unit realization of a predetermined fourth-order function, in accordance with this invention, is obtained by synthesizing a first filter section having a desired second-order function, for example, a low-pass, and synthesizing a second filter section having another desired function, for example, a high-pass and, then, embedding one of the filter sections in the other. The desired fourth-order function is realized provided that the pole-zero pairs of the second-order sections are sufficiently separated in frequency so that each second-order section does not cause appreciable distortion in the attenuation versus frequency characteristic of the other. Preferably, each second-order section yields a substantially constant attenuation in the frequency band in which the other second-order section is affecting the filter attenuation characteristic.

Accordingly, the circuit of FIG. 6 shows one embodiment of the invention which is synthesized by employing the individual second-order sections shown in FIGS. 3 and 4. Since the biquad arrangement of FIG. 4 yields a substantially constant output at "low" frequencies, function $G(s)$ of gain unit 11' of FIG. 3 can be approximated by and replaced by biquad circuit 11 of FIG. 4. The combination of the second-order circuits as illustrated in FIG. 6 only approximates the desired fourth-order function $T(s)$. This is because the attenuation versus frequency characteristics of circuits 10 and 30 overlap and because the biquad circuit of FIG. 4 has a finite input impedance which loads the Twin-T circuit of FIG. 3. The component values of circuits 10 and 30, therefore, are adjusted to compensate for the overlapping frequency characteristics and the loading effect.

To this end, the transfer function for the unsymmetrical Twin-T circuit (FIG. 3) can be written $$T_L(s) = \frac{G(o)(s^2C_1C_2 + G_1G_2/d)}{D(s)} \tag{8}$$

where $d$ is an arbitrary constant adjusted such that $$d = \frac{C_3}{C_1 + C_2} = \frac{G_1 + G_2}{G_3} \tag{9}$$

and $$D(s) = s^2C_1C_2 + s[(1-G(o))G_2(C_1+C_2) + (1-G(o)G_3C_2] + G_1G_2/d + Y_L[S(C_1+C_2)) + G_3] \tag{10}$$

where $$Y_L = sC_L + G_L \tag{11}$$

Equations 8 through 11 are used to describe the fourth-order function obtained by the circuit of FIG. 6 if it is recognized that $G(o)$ is a function of frequency, namely, function $G(s) \approx T_H(s)$, where $T_H(s)$ is defined in Equation 6 and that load admittance $Y_L$ is affected by the input admittance of circuit 11. Admittance $Y_L$ is the parallel combination of $C_L$, $R_L$ and input admittance $Y_{in}$ of circuit 11 and can be expressed $$Y_L = sC_L + G_L + Y_{in}. \tag{12}$$

It can be shown that input admittance $Y_{in}$ of circuit 11 is expressed as $$Y_{in} = \frac{As^2Bs + C}{s^2 + \frac{\omega_H}{Q_H} + \omega_H^2} \tag{13}$$

where $$A = G_C(G_E+G_B)/(G_B+G_C)$$

$$B = \frac{(G_E+G_B)[C_A(G_CG_D-G_AG_F)+C_B(G_CG_D-G_AG_F)-G_EC_AG_BG_F]}{C_AC_B(G_B+G_C)}$$

$$C = G_BG_E(G_CG_D-G_AG_F)/C_AC_B(G_B+G_C) \tag{14}$$

As noted above, $G(s) \approx T_H(s)$, thus by substituting Equation 6 in Equations 8 and 10, it can be shown that desired fourth-order function $T(s)$ may be expressed as $$T(s) = \frac{K(s^2 + \omega_1^2)(s^2 + \omega_2^2)}{s^4 + a_3s^3 + a_2s^2 + a_1 s + a_0} \tag{15}$$

where $$K = K_HC_1C_2/X_1$$
$$a_3 = [\omega_HX_1/Q_H + X_2 - k_HX_3 + A(C_1+C_2)]/X_1$$
$$a_2 = [\omega_HX_2/Q_H + \omega_H^2X_1 + X_4 + AG_3 + B(C_1+C_2)]/X_1$$
$$a_1 = [\omega_HX_4/Q_H + \omega_H^2X_2 - k_H\omega^2_2X_3 + BG_3 + C(C_1+C_2)]\ X_1$$
$$a_o = [\omega_H^2X_4 + CG_3]/X_1 \tag{16}$$

and $$X_1 = C_1C_2 + C_2C_L + C_LC_1$$
$$X_2 = G_2(C_1+C_2) + G_3C_2G_L + (C_1+C_2) + G_3C_L$$
$$X_3 = G_2(C_1+C_2) + G_3C_2$$

$$X_4 = G_1G_2Jd + G_LG_3 \quad (17)$$

Utilizing Equations 15, 16 and 17 and the component values obtained for the circuits of FIG. 3 and FIG. 4, predistorted pole-zero pairs are found so that the resultant circuit of FIG. 6 yields substantially desired predetermined fourth-order function $T(s)$ for the design parameters set out in Equation 2 above.

The loading effect of circuit 11 is partially compensated by considering its input admittance to be a resistor in parallel with a capacitor. Thus, $Y_{in}$ of Equation 13 is expressed as $$Y_{in} = \frac{As^2+Bs+C}{s^2+\frac{\omega_H}{Q_H}s+\omega_H^2} \approx \frac{C}{\omega_H^2} + \left(\frac{B}{\omega_H^2} - \frac{C}{\omega_H^3 Q_H}\right)s \quad (18)$$

where $$G_{in} = \frac{C}{\omega_H^2} \quad (19)$$

and $$C_{in} = \left(\frac{B}{\omega_H^2} - \frac{C}{\omega_H^3 Q_H}\right). \quad (20)$$

Thus, values are obtainable for $R_{in}$ and $C_{in}$ which may be included in the values used for $R_L$ and $C_L$. Employing this technique and the components values for the Twin-T circuit of FIG. 3 and the biquad circuit of FIG. 4 it can be shown that parameters are obtained which are fairly close to the design parameters of Equation 2. A closer approximation of the predistortion is realized by employing an iterative procedure to compensate for the loading and frequency shifts.

By utilizing the techniques described above, a circuit is realizable as shown in FIG. 6 that employs a single gain unit and predistortion of selected circuit component values, in accordance with the invention, to obtain low-pass and high-pass parameters as follows:

$$\omega_L' = 2\pi 100.05 \qquad \omega_H' = 2\pi 2999.9$$
$$Q_L' = 1.004 \qquad Q_H' = 0.9997 \quad (21)$$

These values are sufficiently close to the design parameters set out in Equation 2 for most design purposes. If more exact values are desired, the above compensation procedure may be iterated until a desired precision is obtained.

The above described arrangements, are of course, merely illustrative of the application of the principles of the invention. Numerous arrangements may be devised by those skilled in the art without departing from the spirit and scope of the invention. For example, amplification devices other than differential amplifiers may be used in the single gain unit and numerous RC arrangements may be employed to synthesize a desired fourth-order transfer function.

What is claimed is:

1. An active filter having a predetermined fourth-order transfer function which comprises:

a single gain unit having at least one input and an output;

a first attenuation versus frequency determinate circuit arrangement connected in circuit relationship with the input and output of said gain unit, said first circuit in conjunction with said gain unit yielding a first predetermined second-order transfer function having first predetermined pole-zero pairs; and a second attenuation versus frequency determinate circuit arrangement connected in circuit relationship with said first circuit and with the output of said gain unit, said second circuit in conjunction with said gain unit yielding a second predetermined second-order transfer function having second predetermined pole-zero pairs, said pole-zero pairs of said first and second circuits being separated in frequency so that said first and second circuits do not cause appreciable distortion of the filter transfer function in the frequency band in which the other of said circuits is affecting the attenuation characteristic of said filter, wherein a signal to be filtered is supplied to an input of said second circuit and a filtered version of the supplied signal is obtained at the output of said gain unit.

2. An active filter as defined in claim 1 wherein said first circuit includes a plurality of resistors and capacitors arranged in circuit to obtain said first predetermined second-order function and said second circuit includes a plurality of resistors and capacitors arranged to obtain said second predetermined second-order function.

3. An active filter as defined in claim 2 wherein the component values of certain ones of the resistors and capacitors of said second circuit are adjusted to compensate for loading and frequency shifts caused by said first circuit so that the predetermined fourth-order function is optimized.

4. An active filter as defined in claim 2 wherein said resistors and capacitors of said first circuit are arranged to form a predetermined high-pass section and said resistors and capacitors of said second circuit are arranged to form a predetermined low-pass section.

5. An active filter as defined in claim 2 wherein said resistors and capacitors of said first circuit are arranged to form a predetermined low-pass section and said resistors and capacitors of said second circuit are arranged to form a predetermined high-pass section.

6. An active filter as defined in claim 2 wherein said resistors and capacitors of said first circuit have predetermined component values and are arranged to contribute substantially a constant attenuation in a frequency band in which said second circuit is affecting the attenuation characteristic of the filter and said resistors and capacitors of said second circuit have predetermined component values and are arranged to contribute substantially a constant attenuation in a frequency band in which said first circuit is affecting the attenuation characteristic of the filter.

7. An active filter as defined in claim 1 wherein said gain unit includes a single amplifier having at least an inverting input and an output, said first circuit being in circuit relationship with said at least inverting input and the output of said amplifier and said second circuit being in circuit relationship with said first circuit and the output of said amplifier.

8. An active filter as defined in claim 1 wherein said gain unit includes a single differential amplifier having first and second differential inputs and an output, said first circuit being in circuit relationship with the first and second differential inputs and the output of said differential amplifier and said second circuit being in circuit relationship with an input to said first circuit and the output of said differential amplifier.

9. An active filter as defined in claim 8 wherein said first circuit includes a plurality of resistors and capacitors arranged in a predetermined circuit configuration to yield in combination with said differential amplifier a first prescribed second-order function, and wherein said second circuit includes a plurality of resistors and capacitors arranged in a predetermined circuit configuration to yield in combination with said differential amplifier a second prescribed second-order function, said first and second second-order functions each having pole-zero pairs separated in frequency from those of the other second-order function so that each of said first and second circuits does not contribute appreciable distortion in the filter attenuation characteristic in a frequency band which the other of said circuits is affecting the signal attenuation characteristic.

10. An active filter as defined in claim 8 wherein said first circuit includes a plurality of resistors and capacitors having predetermined component values and being arranged to obtain in combination with said differential amplifier and said second circuit a predetermined high-pass function and wherein said second circuit includes a plurality of resistors and capacitors having predetermined component values and being arranged to obtain in combination with said differential amplifier and said first circuit a predetermined low-pass function.

11. An active filter as defined in claim 8 wherein said first circuit is arranged in a biquad configuration, and wherein said second circuit is arranged in a Twin-T configuration.

12. An active filter as defined in claim 9 wherein the component values of predetermined ones of resistors and capacitors of said second circuit are adjusted to compensate for the loading effects and frequency shifts in the pole-zero pairs of said second circuit caused by said first circuit.

* * * * *